(12) United States Patent
Bonart et al.

(10) Patent No.: US 10,935,590 B2
(45) Date of Patent: Mar. 2, 2021

(54) ELECTRICALLY-VERIFIABLE FUSES AND METHOD OF FUSE VERIFICATION

(71) Applicant: Infineon Technologies AG, Neubiberg (DE)

(72) Inventors: Dietrich Bonart, Bad Abbach (DE); Thomas Gross, Sinzing (DE); Franziska Haering, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 465 days.

(21) Appl. No.: 15/785,773

(22) Filed: Oct. 17, 2017

(65) Prior Publication Data

US 2019/0113562 A1   Apr. 18, 2019

(51) Int. Cl.
| | |
|---|---|
| *G01R 31/26* | (2020.01) |
| *H01L 23/525* | (2006.01) |
| *H01L 23/528* | (2006.01) |
| *H01L 21/66* | (2006.01) |
| *H01L 23/522* | (2006.01) |
| *G01R 31/74* | (2020.01) |

(52) U.S. Cl.
CPC ......... *G01R 31/2607* (2013.01); *G01R 31/74* (2020.01); *H01L 22/14* (2013.01); *H01L 23/5226* (2013.01); *H01L 23/5256* (2013.01); *H01L 23/5283* (2013.01); *H01L 22/34* (2013.01)

(58) Field of Classification Search
CPC ............................ G01R 31/26; G01R 31/2642; G01R 31/2648; G01R 31/2831; G01R 31/31702
See application file for complete search history.

(56) References Cited

U.S. PATENT DOCUMENTS

| | | | |
|---|---|---|---|
| 6,252,292 B1 * | 6/2001 | Brintzinger | ......... H01L 23/5256 257/529 |
| 8,441,266 B1 | 5/2013 | Xiao et al. | |
| 2007/0111402 A1 * | 5/2007 | Tseng | .................. H01L 23/5258 438/130 |
| 2009/0294900 A1 | 12/2009 | Choserot et al. | |
| 2011/0006834 A1 | 1/2011 | Arai | |
| 2011/0101493 A1 | 5/2011 | Wu et al. | |
| 2016/0197039 A1 * | 7/2016 | Bonilla | ................... H01L 23/58 |
| 2017/0092584 A1 | 3/2017 | Sheng et al. | |
| 2017/0141100 A1 | 5/2017 | Tseng et al. | |

FOREIGN PATENT DOCUMENTS

JP      2015176902 A      10/2015

\* cited by examiner

*Primary Examiner* — Tung X Nguyen
(74) *Attorney, Agent, or Firm* — Murphy, Bilak & Homiller, PLLC

(57) ABSTRACT

A semiconductor wafer includes a semiconductor substrate having a plurality of die areas separated from one another by dicing areas. Each die area includes one or more metal layers above the semiconductor substrate and a plurality of fuse structures formed in at least one of the one or more metal layers. Each fuse structure includes a fuse area between first and second fuse heads. Each die area also includes a first pair of contacts connected to different areas of the first fuse head of at least some of the fuse structures. The wafer can be singulated along the dicing areas into individual dies. A corresponding method of fuse verification is also provided.

20 Claims, 4 Drawing Sheets

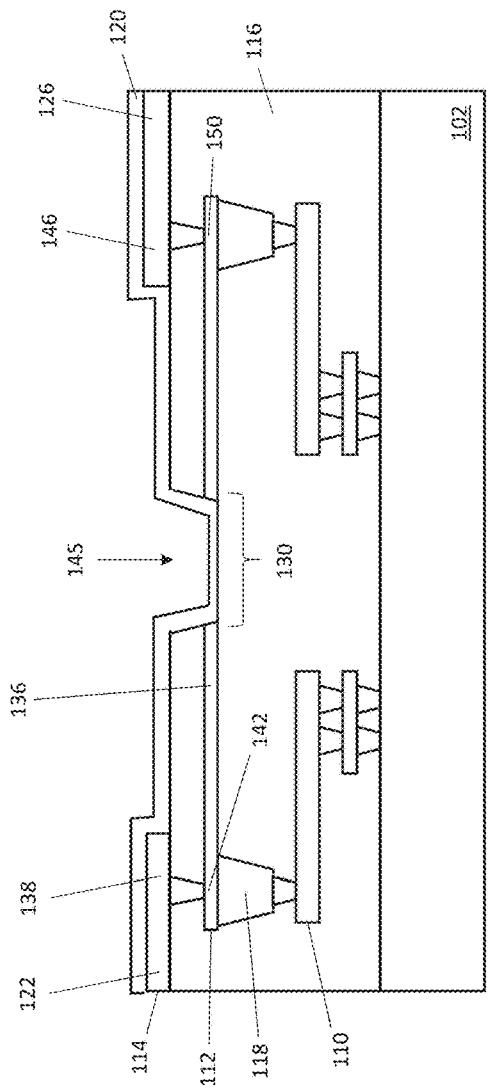
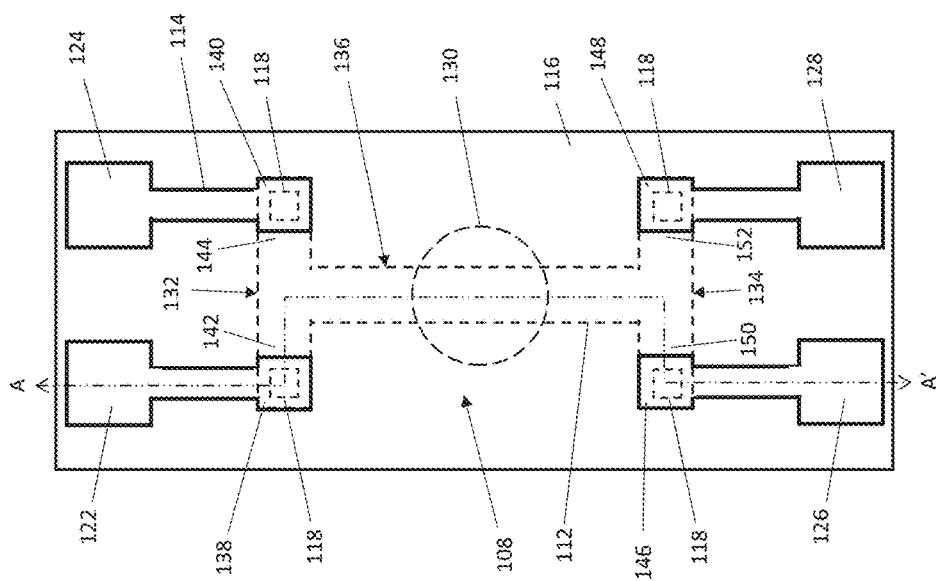
Figure 2B
Figure 2A

ELECTRICALLY-VERIFIABLE FUSES AND METHOD OF FUSE VERIFICATION

TECHNICAL FIELD

The present application relates to semiconductor wafers and dies with fuses, in particular verifying the structural integrity of programmed fuses.

BACKGROUND

Semiconductor devices often include programmable fuses such as laser fuses or e-fuses (electronic fuses) for storing information such as chip ID, configuration information, electrical test data, etc. Programmable fuses also can be used to implement redundancy, e.g. in the case of an integrated processor cache or memory device. A fuse on a semiconductor wafer or die is programmed by removal of fuse metal, often referred to as fuse blow, e.g. by laser cutting or forcing a high current through the fuse element. In the case of laser fuses, a high energy laser is used to evaporate metal (e.g. Al, Cu, etc.) and create a crater or cavity which interrupts the fuse being programmed. By evaporating the fuse metal, the electrical connection between opposing heads of the fuse is broken. The state of the fuses is typically verified after programming and before dicing of the wafer into individual dies.

Additional processing steps are typically performed after fuse programming. Post-fuse programming steps can be performed at the wafer and/or die level. For example, chemical etching is often performed after fuse programming. Chemical etchants can degrade programmed fuses, even if the fuses are covered with a protective passivation layer after programming and prior to etching. For example, NaOH, KOH and $HNO_3$ etchants can enter the die through the fuse cavity and remove any remaining fuse metal, including the fuse heads, resulting in an overly large cavity inside the chip, which can lead to lifetime reliability issues such as crack formation. Conventional fuse verification processes, including electrical testing and visual inspection, cannot reliably differentiate between programmed fuses with a normal (acceptable) fuse cavity size and potentially problematic programmed fuses with an abnormally large fuse cavity.

Hence, there is a need for improved electrically-verifiable fuses and methods of fuse verification.

SUMMARY

According to an embodiment of a semiconductor die, the semiconductor die comprises: a semiconductor substrate; one or more metal layers above the semiconductor substrate; a fuse structure formed in at least one of the one or more metal layers, the fuse structure comprising a fuse area between first and second fuse heads; and a first pair of contacts connected to different areas of the first fuse head.

According to an embodiment of a semiconductor wafer, the semiconductor wafer comprises a semiconductor substrate having a plurality of die areas separated from one another by dicing areas. Each die area comprises: one or more metal layers above the semiconductor substrate; a plurality of fuse structures formed in at least one of the one or more metal layers, each fuse structure comprising a fuse area between first and second fuse heads; and a first pair of contacts connected to different areas of the first fuse head of at least some of the fuse structures.

According to an embodiment of a method of fuse testing for a semiconductor wafer having a plurality of fuse structures each having a fuse area between first and second fuse heads, and a first pair of contacts connected to different areas of the first fuse head of at least some of the fuse structures, the method comprises: measuring an electrical parameter for the first pairs of contacts; and comparing the measured electrical parameter or a value derived from the measured electrical parameter to a pass/fail criteria.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 2A illustrates a top down plan view of one of the fuse structures in more detail.

FIG. 2B illustrates a cross-sectional view of the fuse structure along the line labeled A-A' in FIG. 2A.

DETAILED DESCRIPTION

The embodiments described herein provide an additional sense contact (line) on at least one side of programmable fuses included in a semiconductor wafer or die. In case that processing after fuse programming removes any remaining fuse metal of a blown (programmed) fuse, the resistance inside one or both heads of that fuse changes. The change in resistance can be detected electrically to ensure zero fail-rate in the field with respect to programmed fuses damaged by post-programming processing.

Figure 1:
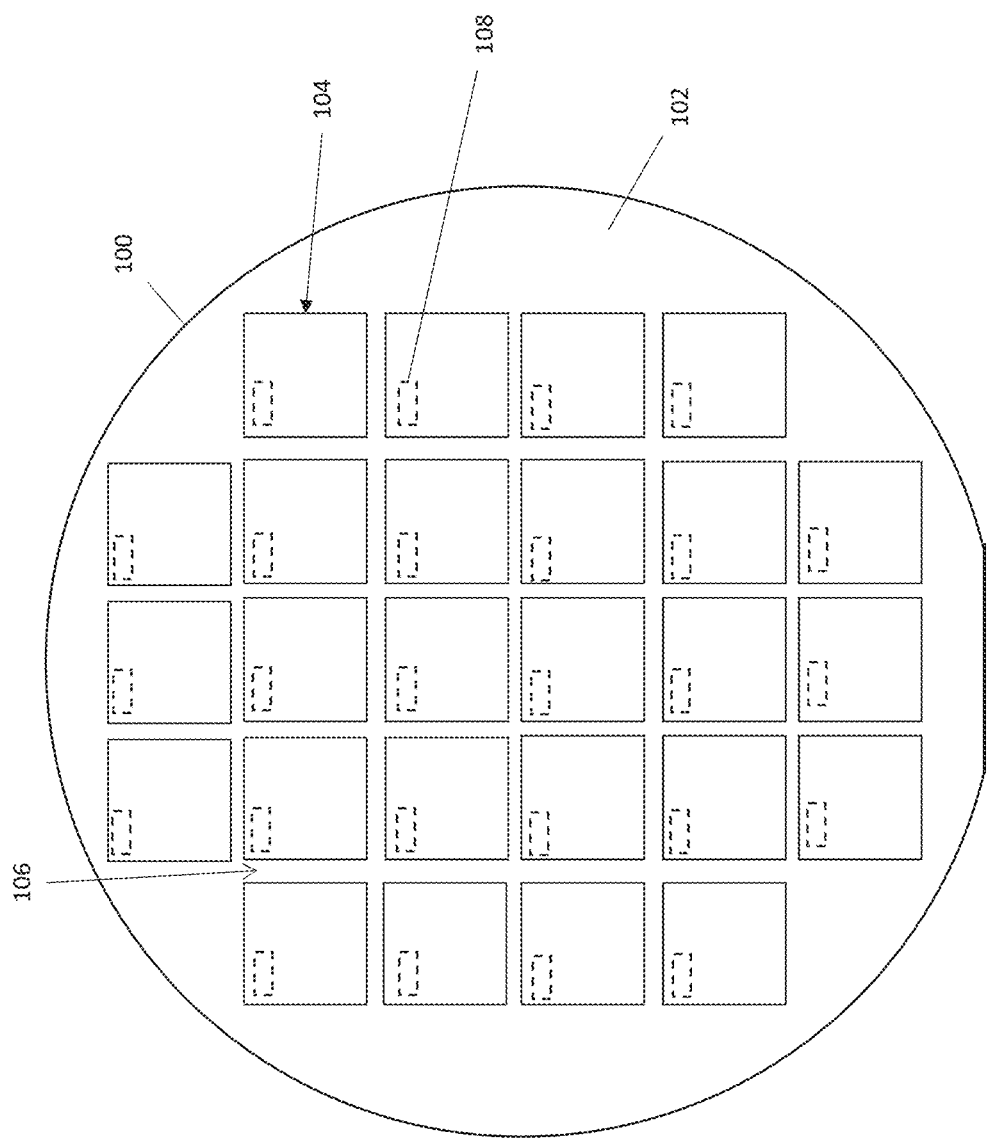
FIG. 1 illustrates a top down plan view of an embodiment of a semiconductor wafer having die areas with fuse structures.

FIG. 1 illustrates an embodiment of a semiconductor wafer 100 that includes a semiconductor substrate 102 having a plurality of die areas 104 separated from one another by dicing areas 106. Each die area 104 contains passive and/or active semiconductor devices such as resistors, capacitors, transistors, diodes, etc. The semiconductor devices in each die area 104 are connected via one or more metal layers disposed above the semiconductor substrate 102, to form an integrated circuit such as a logic circuit, power circuit, a combined logic and power circuit, memory circuit, etc. The semiconductor substrate 102 can be any type of standard semiconductor substrate such as, but not limited to, single element semiconductors (e.g. Si, Ge, etc.), silicon-on-insulator semiconductors, binary semiconductors (e.g. SiC, GaN, GaAs, etc.), ternary semiconductors, etc. with or without epitaxial layer(s). Each die area 104 also includes a plurality of fuse structures 108.

FIG. 2A illustrates a top-down plan view of one fuse structure 108 included in one of the die areas 104 of the wafer 100. FIG. 2B illustrates a corresponding sectional along the line labeled A-A' in FIG. 2A. As mentioned above, each die area 104 includes one or more metal layers 110, 112, 114 disposed above the semiconductor substrate 102. Each metal layer 110, 112, 114 can comprise any standard metallurgy such as, but not limited to, Cu, Al, Au, etc. The metal layers 110, 112, 114 may be formed from the same or different metals. For example, some of the metal layers may comprise Cu and others may comprise Al. In some cases, the fuse metal 136 may comprise Al and the metal layer(s) 114 disposed above the fuse metal 136 may comprise the same (Al) or different metal (e.g. Cu or Au). Other metallurgy combinations for the fuse metal 136 and the metal layers 110, 112, 114 are contemplated and within the scope of the embodiments described herein.

The metal layers 110, 112, 114 are separated from the semiconductor substrate 102 by dielectric material 116 such as silicon dioxide, silicon nitride, etc. Electrical connections between different ones of the metal layers 110, 112, 114 and semiconductor devices formed in the semiconductor substrate 102 can be realized by electrically conductive vias 118. The semiconductor devices are not shown for ease of illustration. A passivation layer 120 can be formed on the uppermost metal layer 114, to protect the wafer after fuse programming. The passivation layer 120 is not shown in FIG. 2A to provide an unobstructed view of the fuse structure 108. The uppermost metal layer 114 includes various pads for providing points of connection to external circuits. Four pads 122, 124, 126, 128 are shown in FIGS. 2A and 2B, and which provide points of external connection for the illustrated fuse structure 108.

The fuse structure 108 is formed in the second uppermost metal layer 112 of the die area 104 in the example illustrated in FIGS. 2A and 2B. In general, the fuse structures 108 described herein can be formed in any of one or more metal layers. The fuse structure 108 includes a fuse area 130 between first and second fuse heads 132, 134. The fuse area 130 is the part of the fuse structure 108 in which the fuse metal 136 is to be removed by programming, e.g. by laser cutting, e-programming (high current programming), etc. Prior to programming, the fuse metal 136 forms a low resistance, continuous connection between the fuse heads 132, 134. This low resistance connection remains intact unless the fuse structure 108 is programmed.

FIG. 2A illustrates the fuse heads 132, 134 and the fuse metal 136 with dashed lines, since these structures would otherwise be obstructed by the dielectric material 116 in FIG. 2A. The fuse structure 108 is shown in a programmed state in FIG. 2B, to illustrate that the fuse metal 136 is removed in the fuse area 130 as a result of the fuse programming process.

In the embodiment illustrated in FIGS. 2A and 2B, a first pair of contacts 138, 140 is connected to different areas 142, 144 of the first fuse head 132 of the fuse structure 108 by a pair of electrically conductive vias 118. Each contact 138, 140 extends in the same uppermost metal layer 114 to a corresponding pad 122, 124. In other embodiments, the first pair of contacts 138, 140 can be formed in the same metal layer as the fuse heads 132, 134 and the fuse metal 136. In this embodiment, the first pair of contacts 138, 140 is electrically connected to the corresponding pads 122, 124 by electrically conductive vies 118. In each case, the pads 122, 124 can be probed during testing to verify the structural integrity of the fuse structure 108 after fuse programming, as described in more detail later herein.

The structural integrity of the fuse cavity 145 formed by the fuse programming process may be comprised by subsequent processing e.g. chemical etching. Depending on the fuse programming process employed, damage to the fuse cavity 145 may be localized to one side or part of the cavity 145. In this case, one pair of contacts can be connected to different areas of the fuse head most likely to be compromised by post fuse blow processing, and may be sufficient for testing the structural integrity of the fuse structure 108 after programming. If the fuse metal is removed all the way to the fuse head as a result of post fuse blow processing, measuring an electrical parameter at the two contacts connected to the fuse head will detect a compromised fuse head if the fuse metal 136 is missing in this region of the fuse structure 108, since the missing fuse metal would interrupt or significantly degrade the electrical connection between the two contacts. Regardless of whether a fuse is programmed (blown) or not, both fuse heads 132, 134 should remain intact (undisturbed) after fuse programming in order for the fuse structure 108 to be reliable. Otherwise, the fuse structure may be comprised which can corrupt electrical data stored by the fuses and lead to other reliability issues such as crack propagation.

A more robust approach is to provide a pair of contacts connected to different areas of both fuse heads 132, 134, to verify the structural integrity of the fuse structure 108 at both ends. According to this embodiment, a second pair of contacts 146, 148 is connected to different areas 150, 152 of the second fuse head 134 of the fuse structure 108. In FIGS. 2A and 2B, the second pair of contacts 146, 148 is formed in a different metal layer than the fuse structure 108 and are connected to the different areas 150, 152 of the second fuse head 134 by a pair of electrically conductive vias. Each contact 146, 148 in the second pair of contacts extends in the same uppermost metal layer 114 to a corresponding pad 126, 128. As explained above, the second pair of contacts 146, 148 instead can be formed in the same metal layer as the fuse structure 108. In either case, the pads 126, 128 connected to the second pair of contacts 146, 148 can be probed during testing to verify the structural integrity of the fuse structure 108 after fuse programming.

Figure 3:
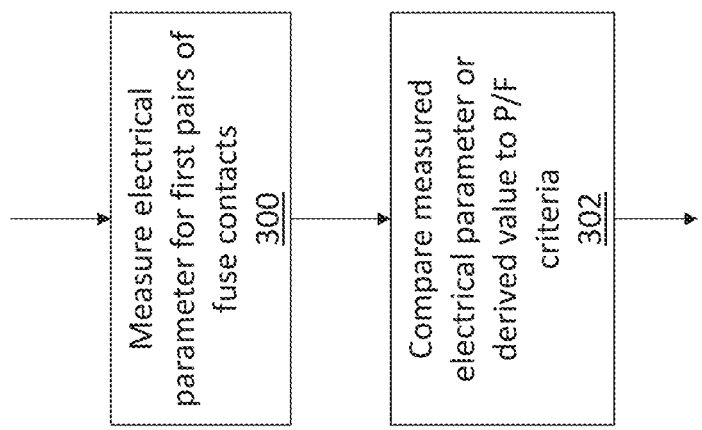
FIG. 3 illustrates a diagram of an embodiment of a method of fuse testing for a semiconductor wafer.

FIG. 3 illustrates an embodiment of a method of verify the structural integrity of the fuse structure 108 after fuse programming. The fuse testing can be carried out on the wafer 100 prior to die singulation, and/or after the die areas 104 are sir gulated into individual semiconductor dies e.g. by dicing along the dicing areas. In either case, the method includes measuring an electrical parameter for the first pair of contacts 138, 140 (Block 300). The electrical parameter is measured by probing the corresponding pads 122, 124 electrically connected to the first pair of contacts 138, 140 and measuring the electrical parameter at those pads 122, 124. The electrical parameter can be a voltage measured across the pads 122, 124, a current measured from one pad to the other pad, an electrical resistance of the path between the pads 122, 124, etc. In each case, the method further includes comparing the measured electrical parameter or a value derived from the measured electrical parameter to a pass (P)/fail (F) criteria (Block 302). For example, a voltage measured across the pads 122, 124 can be compared to a voltage pass/fail criteria which indicates whether the fuse structure 108 passes or fails the test. In another example, a current measured from one pad to the other pad can be compared to a current pass/fail criteria to determine whether the fuse structure 108 passes or fails the test. In yet another example, a resistance measured between the pads 122, 124 can be compared to a resistance pass/fail criteria to determine whether the fuse structure 108 passes or fails the test. In still another example, the resistance can be derived from the voltage and/or current measured at the pads 122, 124.

If the first fuse head 132 is compromised or damaged between the areas connected to the contacts 138, 140 of the first pair of contacts 138, 140, the electrical parameter measured at the corresponding pads 122, 124 electrically connected to the first pair of contacts 138, 140 should fail the pass/fail criteria. If the first fuse head 132 remains fully intact after subsequent processing post fuse blow, the electrical parameter measured at the corresponding pads 122, 124 electrically connected to the first pair of contacts 138, 140 should pass the pass/fail criteria.

The fuse testing method is repeated for a fuse structure 108 having a second pair of contacts 146, 148 connected to different areas 150, 152 of the second fuse head 134. This way, fuse integrity is verified at both heads 132, 134 of the fuse structure. In this case, an electrical parameter is measured for the second pair of contacts 146, 148 (Block 300). The measured electrical parameter or a value derived from the measured electrical parameter is then compared to the pass/fail criteria (Block 302). If the electrical parameter measured for the second pair of contacts 146, 148 passes the pass/fail criteria, the fuse structure 108 is deemed reliable. Otherwise, the fuse structure 108 is flagged as faulty.

The fuse testing process described above and illustrated in FIG. 3 can be streamlined into a more efficient process, by electrically connecting in series the first pairs of contacts 142, 144 of the fuse structures 108 and electrically connecting in series the second pairs of contacts 146, 148 of the fuse structures 108.

Figure 4:
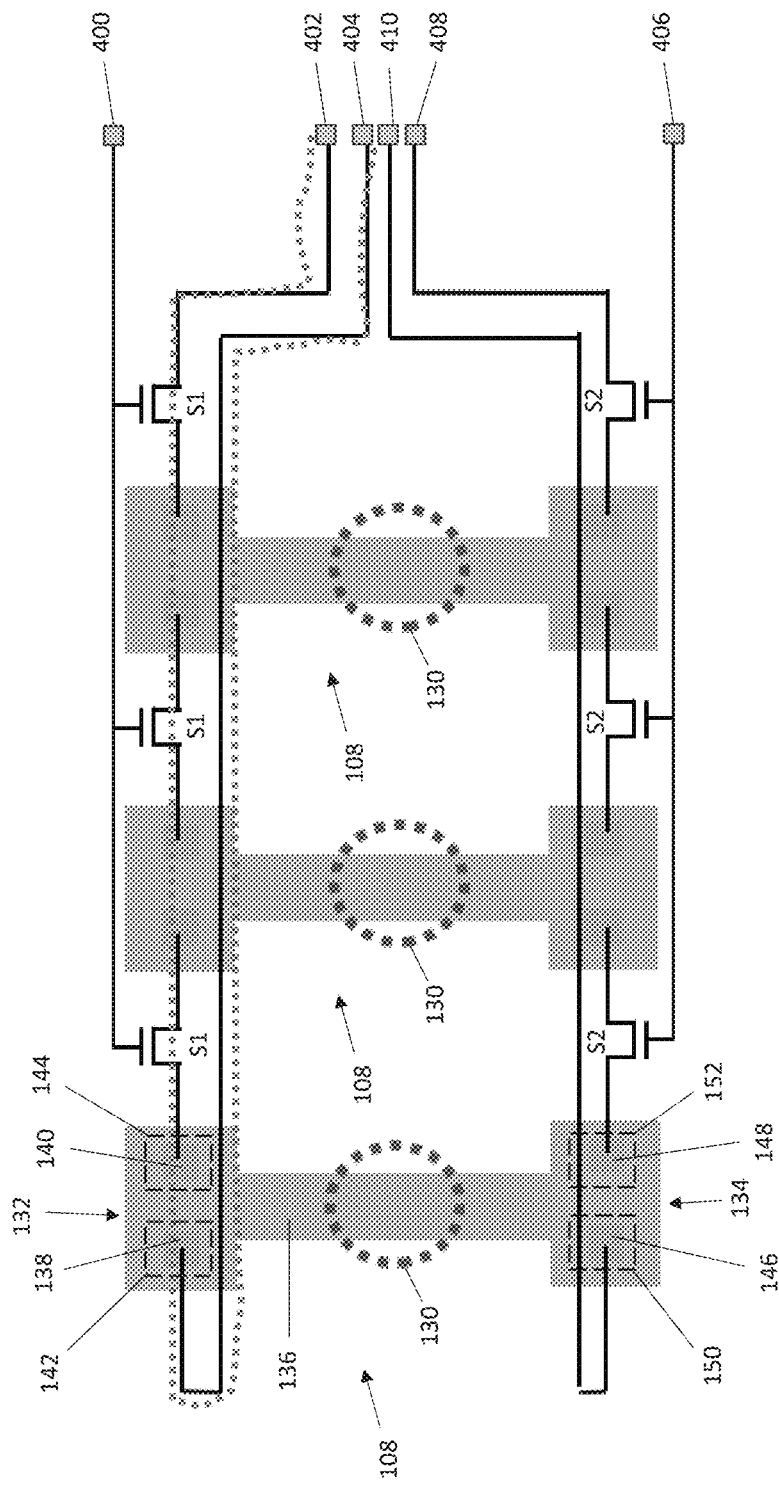
FIG. 4 illustrates a schematic diagram of an embodiment of series-connected fuse structures on a semiconductor die area.

FIG. 4 illustrates an embodiment in which a plurality of first switch devices S1 is configured to electrically connect the first pairs of contacts 142, 144 in series, and a plurality of second switch devices S2 is configured to electrically connect the second pairs of contacts 146, 148 in series during the fuse testing process. The switch devices S1, S2 can be transistors such as PMOS transistors integrated in the semiconductor substrate 102. Each die area 104 or singulated die includes a first pad 400 electrically connected to the gate of each first switch device S1. The first pad 400 is probed during the fuse testing process, and the first pad 400 is driven with an electrical signal that activates the first switch devices S1. When the first switch devices S1 are on (conducting), the first pairs of contacts 142, 144 are electrically connected in series.

Each die area 104 or singulated die also includes a second pad 402 and a third pad 404 electrically connected across the series-connected first pairs of contacts 142, 144. The second and third pads 402, 404 are probed to directly or indirectly measure the electrical resistance between the second and third pads 402, 404. If the measured resistance for the series-connected first pairs of contacts 142, 144 passes the pass/fail criteria, the first fuse head 132 of the fuse structures 108 are deemed reliable. Otherwise, the fuse structure 108 is flagged as faulty. The series electrical path through the first switch devices S1 and the first pairs of contacts 142, 144 is illustrated with a dotted line in FIG. 4.

If the other fuse head 134 similarly has a pair of spaced-apart connects 146, 148 connected to different areas 150, 152 of the respective second fuse heads 134, the second switch devices S2 can be used to electrically connect the second pairs of contacts 146, 148 in series during the fuse testing process. Each die area 104 or singulated die can include a fourth pad 406 electrically connected to the gate of each second switch device S2. The fourth pad 406 is driven with an electrical signal that activates the second switch devices S2 to electrically connect in series the second pairs of contacts 146, 148. Each die area 104 or singulated die also includes a fifth pad 408 and a sixth pad 410 electrically connected across the series-connected second pairs of contacts 146, 148. The fifth and sixth pads 408, 410 are probed to directly or indirectly measure the electrical resistance between the fifth and sixth pads 408, 410. If the measured resistance for the series-connected second pairs of contacts 146, 148 passes the pass/fail criteria, the second fuse head 134 of the fuse structures 108 are deemed reliable. Otherwise, the fuse structure 108 is flagged as faulty.

The number of fuse structures 108 electrically connected in series to simplify fuse testing can depend on the die layout. For example, if all fuse structures 108 are located in the same part of the die area 104, all fuse structures 108 can be electrically connected in series during fuse testing and a single simultaneous test can be used to detect the physical integrity of all fuse structures 108 in the die area 104. However, if groups of fuse structures 108 are located in different parts of the die area, each group can be electrically connected in series during fuse testing independently of the other groups. For example, one group of fuse structures 108 may be disposed along one side of the die area 104 and another group of fuse structures 108 may be disposed along a different side of the die area 104. Each group of fuse structures 108 can be independently connected in series using switch devices e.g. as described above and shown in FIG. 4. This way, a single simultaneous test can be used to detect the physical integrity of all fuse structures 108 in one group, and the same single test can be repeated for each remaining group of fuse structures 108.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor die, comprising:
    a semiconductor substrate;
    one or more metal layers above the semiconductor substrate;
    a fuse structure formed in at least one of the one or more metal layers, the fuse structure comprising a fuse area between first and second fuse heads; and
    a first pair of contacts connected to different areas of the first fuse head,
    wherein in a plan view of the semiconductor die, the fuse area is disposed between the first and second fuse heads.

2. The semiconductor die of claim 1, wherein each contact of the first pair of contacts is connected to the corresponding area of the first fuse head by an electrically conductive via.

3. The semiconductor die of claim 1, further comprising a second pair of contacts connected to different areas of the second fuse head of the fuse structure.

4. The semiconductor die of claim 1, wherein the fuse structure is formed in one of the one or more metal layers, and wherein the first pair of contacts is formed in a metal layer above the metal layer in which the fuse structure is formed.

5. The semiconductor die of claim 1, wherein the semiconductor die comprises a plurality of fuse structures formed in at least one of the one or more metal layers, each fuse structure comprising a fuse area between first and second fuse heads, and wherein a first pair of contacts is connected to different areas of the first fuse head of at least some of the fuse structures.

6. The semiconductor die of claim 5, wherein each first pair of contacts is connected to the different areas of the first fuse head of the corresponding fuse structure by a pair of electrically conductive vias.

7. The semiconductor die of claim 5, further comprising a second pair of contacts connected to different areas of the second fuse head of at least some of the fuse structures.

8. The semiconductor die of claim 7, further comprising:
a plurality of first switch devices configured to electrically connect the first pairs of contacts in series; and
a plurality of second switch devices configured to electrically connect the second pairs of contacts in series.

9. The semiconductor die of claim 5, further comprising a plurality of switch devices configured to electrically connect the first pairs of contacts in series.

10. A semiconductor wafer, comprising a semiconductor substrate having a plurality of die areas separated from one another by dicing areas, each die area comprising:
one or more metal layers above the semiconductor substrate;
a plurality of fuse structures formed in at least one of the one or more metal layers, each fuse structure comprising a fuse area between first and second fuse heads; and
a first pair of contacts connected to different areas of the first fuse head of at least some of the fuse structures,
wherein in a plan view of the semiconductor wafer, the fuse area of each fuse structure is disposed between the first and second fuse heads of the fuse structure.

11. The semiconductor wafer of claim 10, wherein for each die area, each first pair of contacts is connected to the different areas of the first fuse head of the corresponding fuse structure by a pair of electrically conductive vias.

12. The semiconductor wafer of claim 10, wherein each die area further comprises a second pair of contacts connected to different areas of the second fuse head of at least some of the fuse structures.

13. The semiconductor wafer of claim 12, wherein each die area further comprises a plurality of first switch devices configured to electrically connect the first pairs of contacts in series and a plurality of second switch devices configured to electrically connect the second pairs of contacts in series.

14. The semiconductor wafer of claim 10, wherein each die area further comprises a plurality of switch devices configured to electrically connect the first pairs of contacts in series.

15. A method of fuse testing for a semiconductor wafer having a plurality of fuse structures each having a fuse area between first and second fuse heads, and a first pair of contacts connected to different areas of the first fuse head of at least some of the fuse structures, the method comprising:
measuring an electrical parameter for the first pairs of contacts; and
comparing the measured electrical parameter or a value derived from the measured electrical parameter to a pass/fail criteria,
wherein in a plan view of the semiconductor wafer, the fuse area of each fuse structure is disposed between the first and second fuse heads of the fuse structure.

16. The method of claim 15, wherein measuring an electrical parameter for the first pairs of contacts comprises:
activating a plurality of switch devices to electrically connect the first pairs of contacts in series; and
measuring an electrical resistance across the series-connected first pairs of contacts.

17. The method of claim 16,
wherein activating the plurality of switch devices comprises:
probing a first pad electrically connected to a gate of each switch device; and
driving the first pad with an electrical signal that activates the plurality of switch devices,
wherein measuring the electrical resistance across the series-connected first pairs of contacts comprises:
probing a second pad and a third pad electrically connected across the series-connected first pairs of contacts; and
measuring the electrical resistance between the second pad and the third pad.

18. The method of claim 15, wherein the semiconductor wafer has a second pair of contacts connected to different areas of the second fuse head of at least some of the fuse structures, the method further comprising:
measuring an electrical parameter for the second pairs of contacts; and
comparing the measured electrical parameter for the second pairs of contacts or a value derived from the measured electrical parameter for the second pairs of contacts to a pass/fail criteria.

19. The method of claim 18, wherein measuring an electrical parameter for the first pairs of contacts and measuring an electrical parameter for the second pairs of contacts comprises:
activating a plurality of first switch devices to electrically connect the first pairs of contacts in series;
measuring an electrical resistance across the series-connected first pairs of contacts;
activating a plurality of switch devices to electrically connect the second pairs of contacts in series;
measuring an electrical resistance across the series-connected second pairs of contacts.

20. The method of claim 19,
wherein activating the plurality of first switch devices comprises:
probing a first pad electrically connected to a gate of each first switch device; and
driving the first pad with an electrical signal that activates the plurality of first switch devices,
wherein measuring the electrical resistance across the series-connected first pairs of contacts comprises:
probing a second pad and a third pad electrically connected across the series-connected first pairs of contacts; and
measuring the electrical resistance between the second pad and the third pad,
wherein activating the plurality of second switch devices comprises:
probing a fourth pad electrically connected to a gate of each second switch device; and driving the fourth pad with an electrical signal that activates the plurality of second switch devices, wherein measuring the electrical resistance across the series-connected second pairs of contacts comprises:

probing a fifth pad and a sixth pad electrically connected across the series-connected second pairs of contacts; and measuring the electrical resistance between the fifth pad and the sixth pad.

* * * * *